(12) United States Patent  (10) Patent No.: US 6,680,775 B1
Hirakawa  (45) Date of Patent: Jan. 20, 2004

(54) SUBSTRATE TREATING DEVICE AND METHOD, AND EXPOSURE DEVICE AND METHOD (75) Inventor: Shinichi Hirakawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/671,481

(22) Filed: Sep. 27, 2000

Related U.S. Application Data (63) Continuation of application No. PCT/JP99/01703, filed on Apr. 1, 1999.

(30) Foreign Application Priority Data

Apr. 2, 1998 (JP) .......................................... 10-090464

(51) Int. Cl.⁷ .................... G03B 27/62; G03B 27/42; G03D 5/00; G06F 7/08; B65H 1/00
(52) U.S. Cl. ............................ 355/75; 355/53; 355/68; 355/77; 396/611; 235/381; 414/222.01; 414/217.1; 414/935; 414/937; 414/939; 414/940
(58) Field of Search ................................ 355/75, 53, 68, 355/77; 396/611; 235/381; 414/222.01, 935, 217.1, 939, 937, 940

(56) References Cited

U.S. PATENT DOCUMENTS

| 4,886,412 A | * | 12/1989 | Wooding et al. |
| 4,999,671 A | * | 3/1991 | Iizuka |
| 5,364,219 A | * | 11/1994 | Takahashi et al. |
| 5,431,600 A | * | 7/1995 | Murata et al. |
| 5,442,163 A | * | 8/1995 | Nakahara et al. |
| 5,498,118 A | * | 3/1996 | Nakahara |
| 5,685,684 A | * | 11/1997 | Kato et al. |
| 5,695,562 A | * | 12/1997 | Mizosaki |
| 5,721,608 A | * | 2/1998 | Taniguchi .................... 355/53 |
| 5,784,799 A | * | 7/1998 | Kato et al. |
| 5,788,458 A | * | 8/1998 | Bonora et al. |
| 5,826,129 A | * | 10/1998 | Hasebe et al. .............. 396/611 |
| 5,828,572 A | * | 10/1998 | Hasegawa et al. |
| 5,876,280 A | * | 3/1999 | Kitano et al. ............... 454/187 |
| 5,909,030 A | * | 6/1999 | Yoshitake et al. |
| 6,019,563 A | * | 2/2000 | Murata et al. |
| 6,099,241 A | * | 8/2000 | Inoue et al. |
| 6,129,496 A | * | 10/2000 | Iwasaki et al. |
| 6,136,168 A | * | 10/2000 | Masujima et al. |
| 6,351,684 B1 | * | 2/2002 | Shirley et al. |

FOREIGN PATENT DOCUMENTS

| JP | 4-118913 | | 4/1992 |
| JP | 6-110515 | | 4/1994 |
| JP | 7-172578 | | 7/1995 |
| JP | 7-240366 | | 9/1995 |
| JP | 9-260461 | * | 3/1996 |
| JP | 8-181183 | | 7/1996 |
| JP | 9-260461 | | 10/1997 |

* cited by examiner

Primary Examiner—Frank G. Font
Assistant Examiner—Khaled Brown
(74) Attorney, Agent, or Firm—Oliff & Berridge PLC (57) ABSTRACT The mask guiding device of the present invention has a mask guiding device that guides a substrate received from the outside. The mask guiding device is provided with a plurality of receiving portions that receives said mask from the outside.

22 Claims, 9 Drawing Sheets

SUBSTRATE TREATING DEVICE AND METHOD, AND EXPOSURE DEVICE AND METHOD

This is a continuation of International Application No. PCT/JP99/01703 filed Apr. 1, 1999 which designated the U.S.

BACKGROUND OF THE INVENTION

1. Field of Invention

The present invention relates to a substrate treating device and method therefore, in which a specific treatment is performed using a substrate. More particularly, the present invention relates to an exposure device and method therefore, in which a projecting and transferring treatment is performed using a substrate such as a mask or the like.

2. Description of Related Art

When producing a semiconductor element or liquid crystal element using a photolithography process, substrate treating devices, i.e., exposure devices, are generally employed, in which the pattern image formed by the photomask or reticle is projected via a projection optical system onto a substrate such as a semiconductor wafer or glass plate that has been coated with a photosensitive agent. In order to make multiple circuit patterns on the wafer surface when producing the semiconductor element in these types of exposure devices, the exposure is performed using from 10 to 20 or more reticles to stack the aforementioned patterns on top of one another.

Each of these reticles is subject to contamination due to adherence of environmental dust or from direct contact during handling by workers, as well as damage from contact with nearby parts. For this reason, it is the general practice to handle the reticles after housing them in specialized reticle cases. A reticle stocker for storing the reticles is provided in the clean room where the exposure device is located. A number of reticles are housed and stored inside this reticle stocker. Recently, it has been proposed to guide the reticles between the reticle stocker and the exposure device using an automated guiding robot that guides the reticle case.

Figure 9:
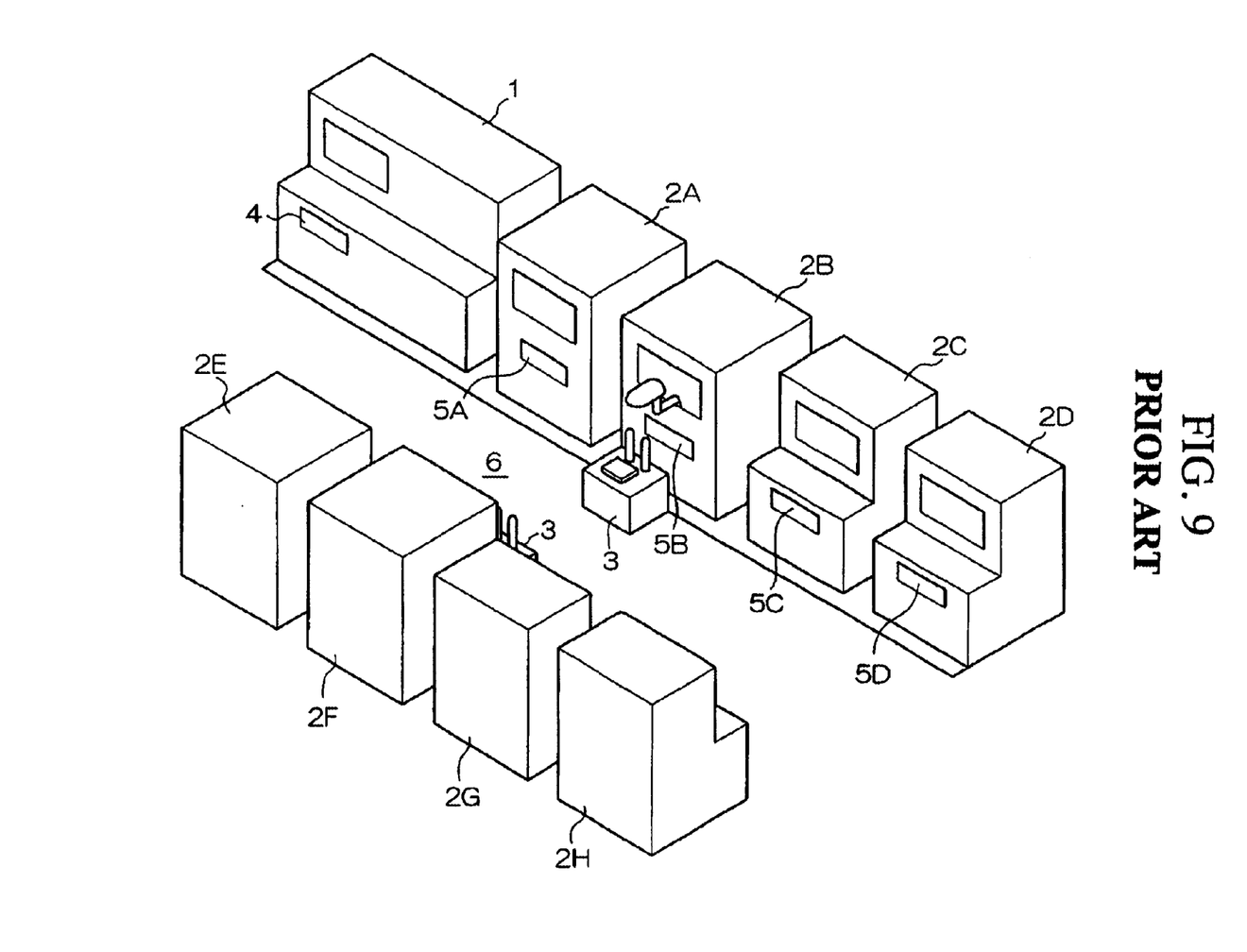
FIG. 9 is an external perspective view of one example of an exposure device according to the conventional technology.

FIG. 9 shows the automated guiding robot (referred to as an "AGV", i.e., automated guided vehicle, hereinafter), the exposure device and the reticle stocker that are disposed inside the clean room. Reticle stocker 1 has several hundred reticle storing shelves inside an air-conditioned chamber.

Multiple exposure devices 2A–2H are disposed adjacent to reticle stocker 1. Each exposure device 2A–2H is provided with a chamber, the inside of which is maintained at a constant environment by means of various air-conditioning devices. The main portion of the exposure device is housed in the chamber, along with a reticle guiding device and a wafer guiding device.

One or several AGV 3,3 run between reticle stocker 1 and the various exposure devices 2A–2H. AGV 3,3 are provided with a guiding arm that has multiple degrees of freedom. AGV 3,3 give reticle cases to and receive reticle cases from a reticle case guiding device that is disposed inside reticle stocker 1 through opening door 4 of reticle stocker 1. AGV 3,3 also give reticle cases to and receive reticle cases from guiding arms that are disposed inside exposure devices 2A–2H via the opening doors 5A–5H of the chambers.

Respective opening door 4 and opening doors 5A–5D of reticle stocker 1 and exposure devices 2A–2D are provided in a row so as to meet running path 6 of AGV 3,3 that extends in one direction. Opening doors 5E–5H, which are formed in the front surface of exposure devices 2E–2H, are provided in a line opposite reticle stocker 1 and exposure devices 2A–2D so as to meet running path 6.

The reticle which is required in exposure devices 2A–2H is guided by AGV 3,3 from reticle stocker 1 to exposure devices 2A–2H. Reticles not needed in exposure devices 2A–2H are returned by AGV 3,3 from exposure devices 2A–2H to reticle stocker.

In other words, when removing the reticles required in exposure devices 2A–2H, AGV 3,3 stops at a specific site, in reticle stocker 1. Next, opening door 4 on the front surface of reticle stocker 1 opens, and the required reticle is taken from reticle stocker 1.

AGV 3,3 moves to the location of the specified exposure device 2A–2H by automatically running along running path 6. AGV 3,3 faces the reticle case transfer position, drives the 3 guiding arm, and gives the reticle case to or receives the reticle case from the guiding device that is disposed inside exposure devices 2A–2H.

However, a conventional substrate treating device such as described above has the following problems. Namely, reticle stocker 1 and exposure devices 2A–2H, which must give reticle cases to and receive reticle cases from AGV 3,3, are disposed so as that opening doors 4 and 5A–5H which are formed in the front surface meet running path 6. For this reason, when disposing a plurality of exposure devices as described above, the exposure devices must be arrayed in a straight line so as to face the same direction. This results in an unnecessary restriction being placed on the layout design.

Figure 10:
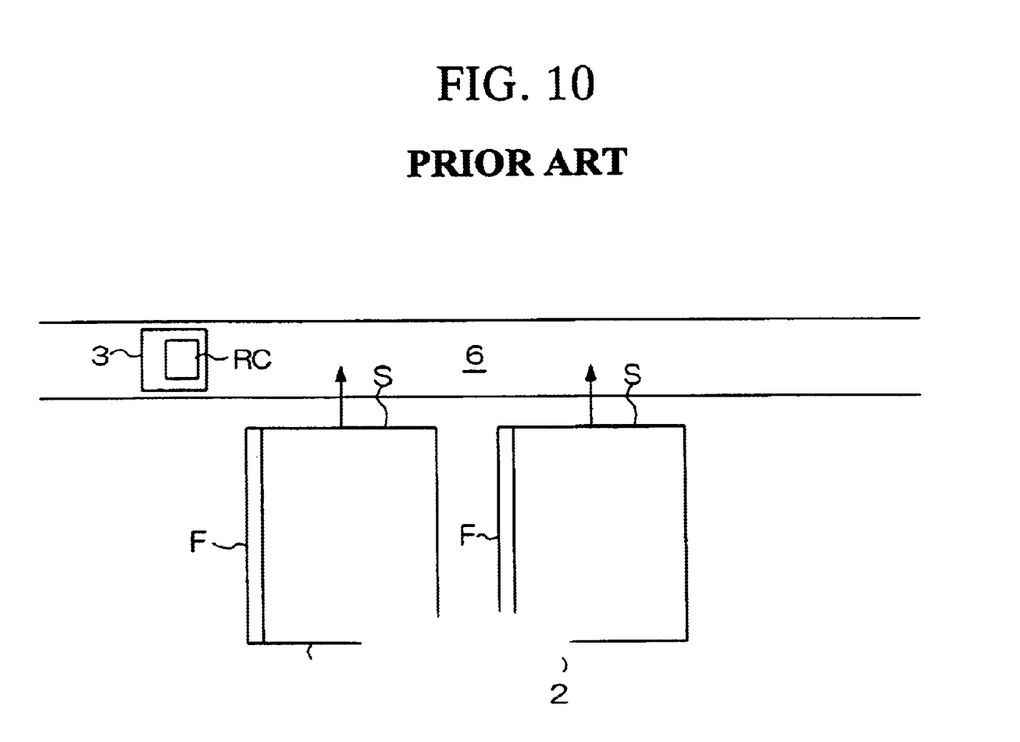
FIG. 10 is a planar view in which an exposure device according to the conventional technology is disposed so that the opening doors meet the running path.

Further, as shown in FIG. 10, a plurality of exposure devices 2,2, in which opening doors are not provided in the front surface F but rather in side surface S, can be disposed in the same direction. In this case, it is necessary to maintain a fixed space at the front surface of exposure device 2 for the purpose of maintenance and the like. This impairs effective utilization of space for disposing the exposure device as a result.

When the devices are not disposed in a straight line due to the requirements of the layout, it becomes necessary to provide a running path 6 for AGV 3,3 that meets the opening doors of each of the devices. Accordingly, a single running path 6 is not sufficient for this purpose. For this reason, running path 6 must to provided in separate segments so as to enable AGV 3,3 to access all of the devices. As a result, AGV 3,3 are no longer able to efficiently guide the reticles. Thus, in the same manner as described above, effective utilization of the space for disposing the devices is impaired.

The present invention was conceived in view of the preceding matters, and has as its objective the provision of a substrate treating device and method, and an exposure device and method, that makes effective utilization of the space for disposing the device and enables efficient guiding of the substrate, without placing restrictions on the design of the layout during installation.

SUMMARY OF THE INVENTION

In order to achieve the above-stated objective, the present invention employs the following design corresponding to FIGS. 1 through 8 in which embodiments of the present invention are pictured.

The substrate treating device according to the first aspect of the present invention is provided with a substrate guiding device for guiding a substrate received from outside the substrate treating device, and carries out a specific treatment using the substrate guided by the substrate guiding device. The substrate treating device includes a plurality of receiving portions for receiving substrates from outside the substrate treating device.

Accordingly, in the present invention's substrate treating device, it is possible to select from a plurality of receiving portions to receive a substrate for the substrate guiding device. Thus, when disposing substrate treating devices, it is not absolutely essential that the devices all face the same direction. Rather, substrate treating devices can be disposed so that at least one of the plurality of receiving portions meets running paths. Conversely, it is also possible to provide running paths for AGV after disposing substrate treating devices in the most optimal arrangement.

The substrate treating device according to the second aspect of this invention is characterized in that, in the substrate treating device of the first aspect, a first receiving portion and a second receiving portion of the plurality of receiving portions are provided on different surfaces of the substrate treating device.

Accordingly, in the present invention's substrate treating device, the receiving portion that receives a substrate for the substrate guiding device can be selected from a first receiving portion and a second receiving portion that are present on different surfaces of the substrate treating device. For this reason, when disposing the substrate treating devices, it is not absolutely essential that the devices all face the same direction. Rather, substrate treating devices can be disposed so that at least one surface of the different surfaces to which first receiving portion and second receiving portion are disposed meets running paths.

Conversely, it is also possible to provide the running paths for AGV so as to meet at least one surface of the aforementioned different surfaces after disposing substrate treating devices in the most optimal arrangement in the layout design.

The substrate treating device according to the third aspect of this invention is characterized in that, in the substrate treating device of the second aspect, the different surfaces are roughly perpendicular to one another.

Accordingly, in the present invention's substrate treating device, the receiving portion that receives a substrate for the substrate guiding device can be selected from a first receiving portion and a second receiving portion that are present on surfaces of the substrate treating device that are roughly perpendicular to one another. For this reason, when disposing the substrate treating devices, it is not absolutely essential that the devices all face the same direction. Rather, substrate treating devices can be disposed so that at least one surface of perpendicular surfaces to which first receiving portion and second receiving portion are disposed meets running paths.

Conversely, it is also possible to provide the running paths for AGV so as to meet at least one surface of the aforementioned roughly perpendicular surfaces after disposing substrate treating devices in the most optimal arrangement in the layout design.

The exposure device according to the fourth aspect of this invention exposes the pattern of a mask, which is a patterned substrate, onto a photosensitive substrate, and employs one of the substrate treating devices of the first through third aspects for guiding the mask.

Accordingly, the present invention's exposure device enables the pattern image on a mask to be exposed onto a photosensitive substrate. When guiding this mask, it is possible to select, a receiving portion that receives a mask for the substrate guiding device from a plurality of receiving portions. For this reason, when disposing the exposure devices, it is not absolutely essential that the devices all face the same direction. Rather, exposure devices can be disposed so that at least one of the plurality of receiving portions for the substrate guiding device meets running paths.

Conversely, it is also possible to provide the running paths for AGV after disposing exposure devices in the most optimal arrangement in the layout design.

The exposure device according to the fifth aspect of this invention is characterized in that, in the exposure device of the fourth aspect, a box-shaped chamber is provided that encloses exposure devices, and in that at least one of the plurality of receiving portions is present on the side surface of the box-shaped chamber.

Accordingly, the present invention's exposure device enables the pattern image on a mask to be exposed onto a photosensitive substrate. When guiding this mask, it is possible to select the receiving portion that receives a mask for the substrate guiding device from a plurality of receiving portions.

When a receiving portion on the side surface of the box-shaped chamber is selected, the substrate guiding device can receive the mask from the outside of the box-shaped chamber at the side surface.

The substrate treating method according to the sixth aspect of this invention is characterized in that a substrate is received via at least one of a plurality of receiving portions that are provided for a substrate guiding device, the substrate is guided by the substrate guiding device, and a specific treatment is performed using the substrate.

Accordingly, in the present invention's substrate treating method, it is possible to select a receiving portion that receives a substrate for a substrate guiding device from a plurality of receiving portions. Thus, when disposing substrate treating devices, it is not absolutely essential that the devices all face the same direction. Rather, substrate treating devices can be disposed so that at least one of the plurality of receiving portions for the substrate guiding device meets running paths. Conversely, it is also possible to provide the running paths for AGV after disposing substrate treating devices in the most optimal arrangement in the layout design.

The substrate treating method according to the seventh aspect of this invention is characterized in that, in the substrate treating method of the sixth aspect, the substrate is received via at least one of a first receiving portion and a second receiving portion from among a plurality of receiving portions that are provided on different surfaces of the substrate treating device.

Accordingly, in the present invention's substrate treating method, the receiving portion that receives a substrate for the substrate guiding device can be selected from a first receiving portion and a second receiving portion that are present on different surfaces of the substrate treating device. For this reason, when disposing the substrate treating devices, it is not absolutely essential that the devices all face the same direction. Rather, substrate treating devices can be disposed so that at least one surface of the different surfaces to which first receiving portion and second receiving portion are disposed meets running paths.

Conversely, it is also possible to provide the running paths for AGV so as to meet at least one surface of the aforementioned different surfaces after disposing substrate treating devices in the most optimal arrangement in the layout design.

The substrate treating method according to the eighth aspect of this invention is characterized in that, in the substrate treating method of the seventh asepct, the substrate is received via at least one of the first receiving portion and the second receiving portion which are provided at different surfaces of the substrate treating device that are roughly perpendicular to one another.

Accordingly, in the present invention's substrate treating device, the receiving portion for the substrate to be guided by the substrate guiding device can be selected from a first receiving portion and a second receiving portion that are present on surfaces of the substrate treating device that are roughly perpendicular to one another. For this reason, when disposing the substrate treating devices, it is not absolutely essential that the devices all face the same direction. Rather, substrate treating devices can be disposed so that at least one surface of perpendicular surfaces to which first receiving portion and second receiving portion are disposed meets running paths.

Conversely, it is also possible to provide the running paths for AGV so as to meet at least one surface of the aforementioned roughly perpendicular surfaces after disposing substrate treating devices in the most optimal arrangement in the layout design.

The exposure method according to the ninth asepct of this invention exposes the pattern of a mask, which is a patterned substrate, onto a photosensitive substrate, and employs one of the substrate treating methods according to the sixth through eighth aspects.

Accordingly, the present invention's exposure method enables the pattern image on a mask to be exposed onto a photosensitive substrate. When guiding this mask, it is possible to select a receiving portion that receives a mask for a substrate guiding device from a plurality of receiving portions. For this reason, when disposing the exposure devices, it is not absolutely essential that the devices all face the same direction. Rather, exposure devices can be disposed so that at least one of the plurality of receiving portions for the substrate guiding device meets running paths.

Conversely, it is also possible to provide the running paths for AGV after disposing exposure devices in the most optimal arrangement in the layout design.

The exposure method according to the tenth aspect of this invention is characterized in that, in the exposure method according to the ninth aspect, a mask is received via at least one of the plurality of receiving portions that are present on the side surface of a box-shaped chamber that encloses exposure devices.

Accordingly, the present invention's exposure method enables the pattern image on a mask to be exposed onto a photosensitive substrate. When guiding this mask, it is possible to select a receiving portion that receives a mask for the substrate guiding device from a plurality of receiving portions.

When receiving portion on the side surface of a box-shaped chamber is selected, the substrate guiding device can receive the mask from the outside of the chamber at the side surface.

DETAILED DESCRIPTION OF PREFERRED EMBODIMENTS

A first embodiment of the substrate treating device according to this invention will now be explained with reference to FIGS. 1 through 6. The substrate treating device will be explained using as an example the case of an exposure device that performs a projecting and transferring treatment on a substrate. This explanation further employs an example of the case in which there are two sites at which substrate transfer by a substrate giving and receiving device is performed. In these figures, structural components equivalent to those shown in FIGS. 9 and 10, in which a conventional example is pictured, have been assigned the same numeric symbol, and an explanation thereof has been omitted.

Figure 2:
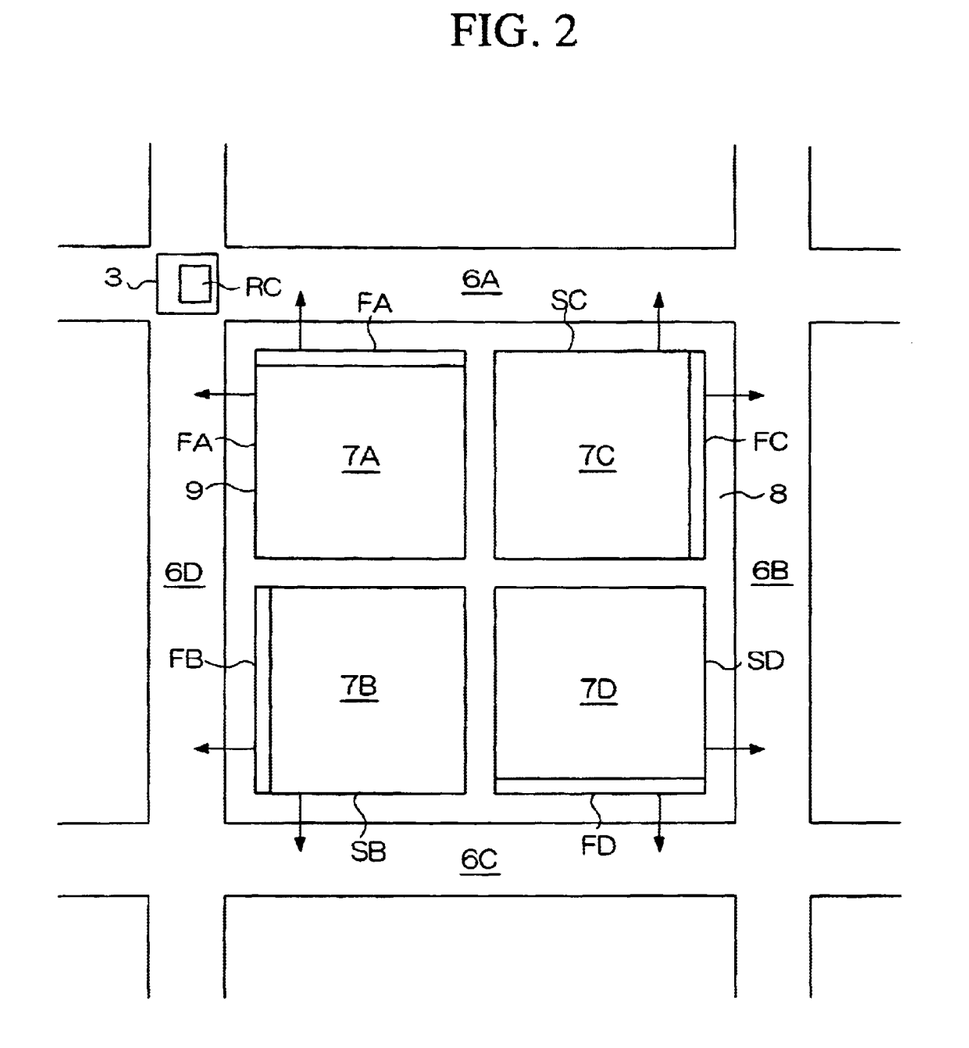
FIG. 2 shows a first embodiment of the present invention, and is a schematic structural view in which exposure devices are disposed so that a plurality of opening doors all meet running paths.

Numeric symbols 7A~7D in FIG. 2 indicate exposure devices that are disposed in a clean room. Numeric symbol 3 is an AGV. Exposure devices (substrate treating devices) 7A~7D are disposed in device installation 8, which is surrounded on its four sides by the running paths 6A~6D for AGV 3 and is provided in the form of a lattice, so that the respective front surfaces FA~FD of exposure devices 7A~7D meet different running paths 6A~6D.

Figure 1:
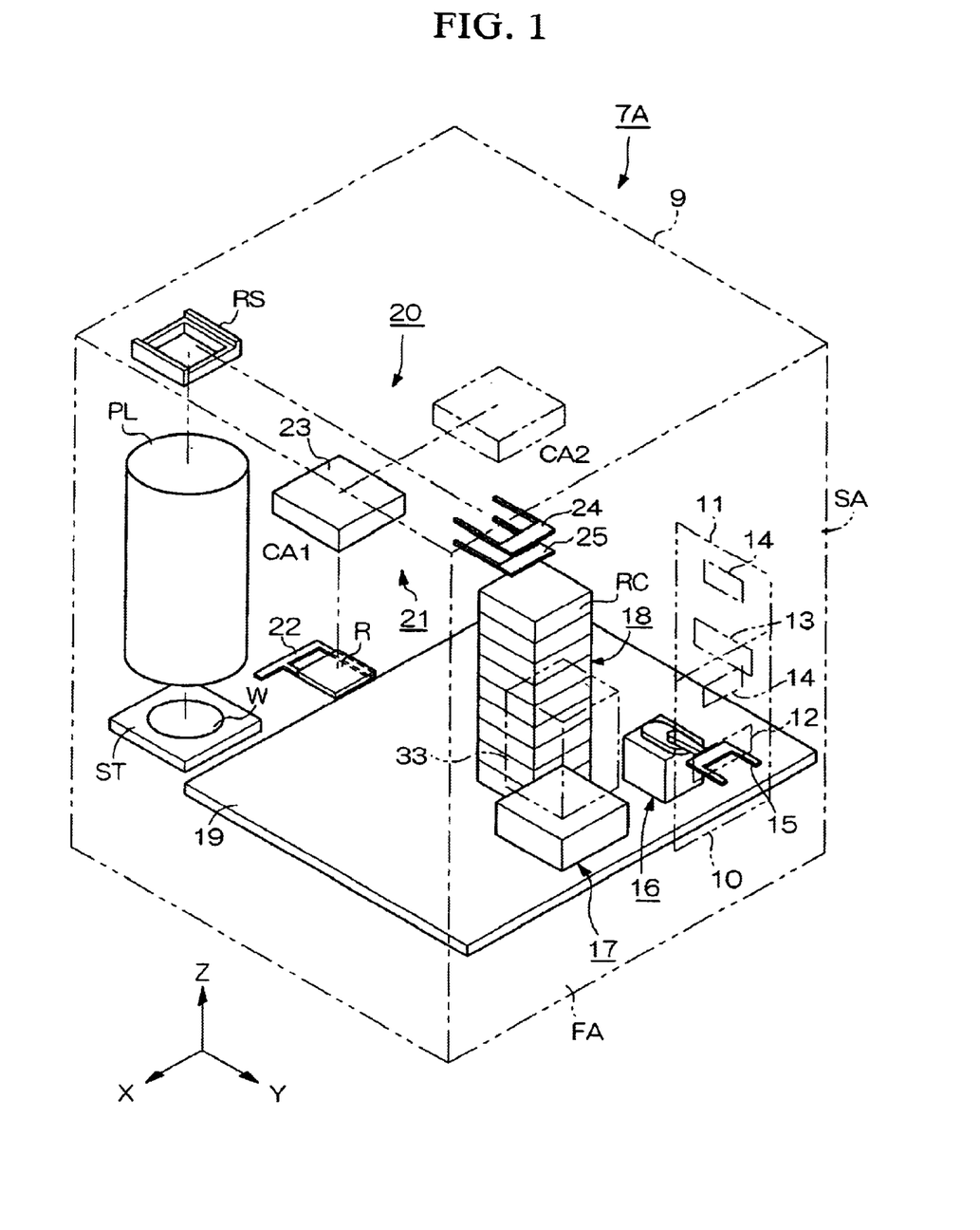
FIG. 1 shows a first embodiment of the present invention, and is a schematic structural view in which a guiding device that can receive reticle cases by projecting out through a plurality of opening doors is disposed inside the chamber of an exposure device.

FIG. 1 is a schematic structural view showing an example of the internal structure of exposure device 7A. (Exposure devices 7B~7C have the same design as exposure device 7A, so that an explanation thereof will be omitted.) This figure shows only the reticle guiding system and the exposure system. The wafer guiding system and air-conditioning system for maintaining a specific environment within the chamber have been omitted from the figure. Note that Z designates the vertical direction (i.e., the direction of the optical axis in the exposure and projecting systems) in this figure, while the directions perpendicular to Z are denoted as the X and Y directions.

Figure 3:
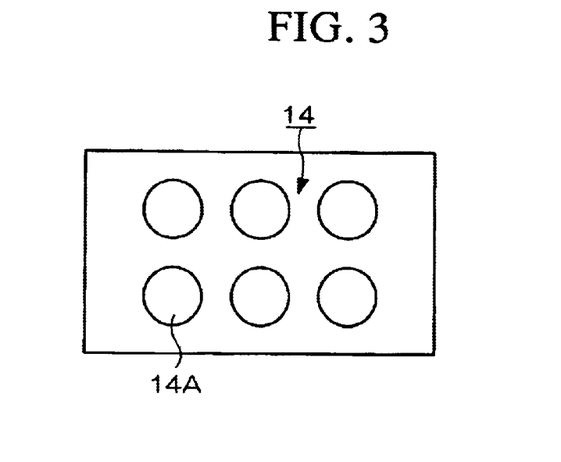
FIG. 3 is a front view of the visible mark forming the present invention's exposure device.

Employing reticle R (mask), which is the substrate received from outside the exposure device 7A, exposure device 7A exposes wafer W (photosensitive substrate) to the pattern on reticle R. Exposure device 7A is provided with a box-shaped chamber 9 enclosing the device. Respective opening/closing doors 10,11 are provided to front surface FA and side surface SA, which is roughly perpendicular to front surface FA, of chamber 9, and are capable of opening and closing via a hinge (not shown). Horizontally long opening door (first receiving portion) 12 and opening door (second receiving portion) 13 are provided to opening/closing doors 10,11. Further, visible marks 14,14 as shown in FIG. 3 are provided to opening/closing doors 10,11 respectively.

A guiding device (substrate guiding device) 16 for receiving reticle R which is guided from outside the exposure device 7A while housed in a roughly rectangular reticle case RC is provided to the inside of opening/closing door 10,11. Guiding device 16 is designed so that a guiding arm 15 projects outward from either opening door 12,13 and can receive reticle case RC.

Guiding arm 15 is designed to enable movement in the vertical direction (Z direction). In addition, guiding arm 15 can rotate within the X-Y plane and is capable of telescopic motion with respect to its rotational axis. A reticle case positioning device 17, for correcting the XYθ direction of reticle case RC, and a reticle library 18, for storing a plurality of reticles R housed in respective reticle cases RC, are disposed to the side of guiding device 16 on top of a base 19.

Figure 4:
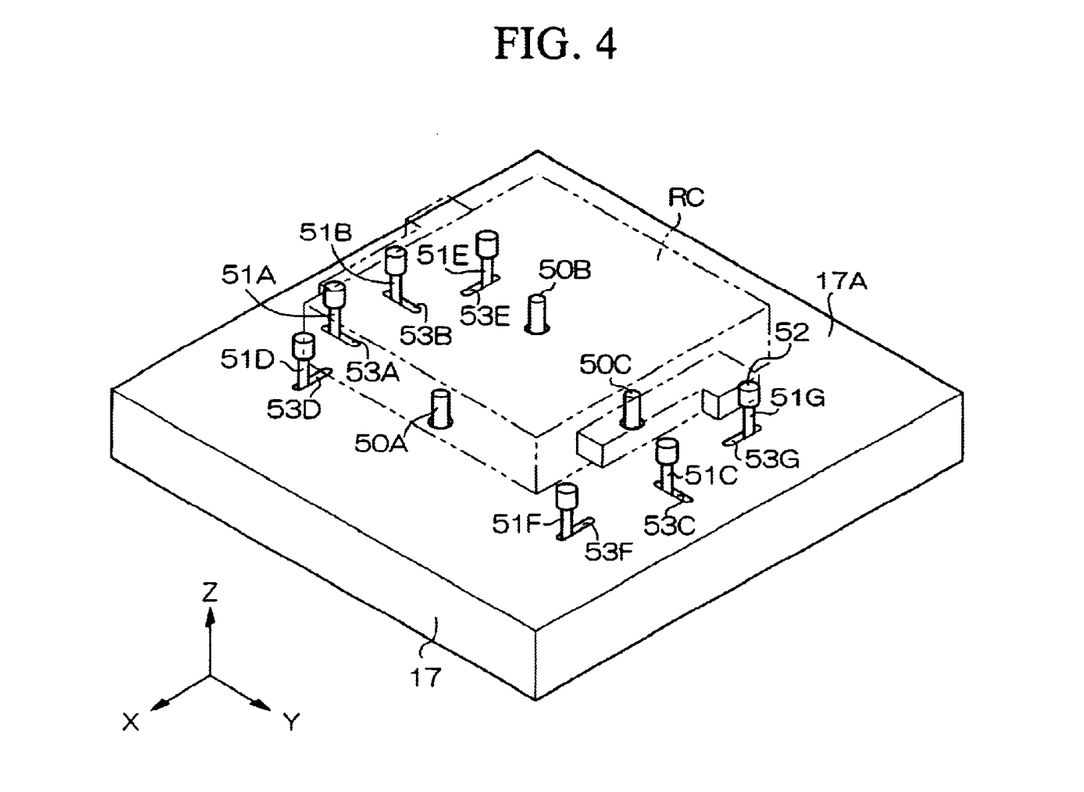
FIG. 4 is an external perspective view of the reticle case positioning device that is provided at the present invention's exposure device.

As shown in FIG. 4, the upper surface of reticle case positioning device 17 forms a reticle case loading surface 17A on which reticle cases RC transferred from guiding arm 15 are disposed. Three reticle case transferring pins 50A, 50B, 50C, and alignment pins 51A~51G for correcting the position of the XYθ direction of reticle case RC, are provided on the reticle case loading surface 17A. Transfer pins 50A, 50B, 50C are designed so as to give reticle case RC to and receive reticle case RC from guiding arm 15 by means of synchronized vertical motion, for example.

A rotating roller 52 that can rotate freely around the Z axis is provided at the end of alignment pins 51A~51G. Alignment pins 51A, 51B, 51C can move in the Y direction along slots 53A, 53B, 53C, which are formed in reticle case loading surface 17A and are long and narrow in the Y direction.

Alignment pins 51D, 51E, 51F, and 51G can move in the X direction along slots 53D, 53E, 53F, and 53G, which are formed in reticle case loading surface 17A and are long and narrow in the X direction. These transfer pins 50A~50C and alignment pins 51A~51G are designed to be driven by a driving device such as an air cylinder or motor that is housed inside reticle case positioning device 17.

An exposure system 20 is disposed inside chamber 9 as shown in FIG. 1.

Exposure system 20 includes an illuminating optical system, not shown in the figures, for illuminating with exposure light a reticle R held on top of reticle stage RS; a substrate stage ST on which a wafer W is loaded and that is capable of moving in the XY direction; and a projection optical system PL for projecting the pattern image of reticle R held on top of reticle stage RS onto wafer W.

A reticle guiding device 21 is disposed in between reticle library 18 and exposure system 20. Reticle guiding device 21 guides a specific reticle R from a plurality of reticle cases RC that are stored in reticle library 18 on to reticle stage RS of exposure system 20. In addition, reticle guiding device 21 returns a reticle R no longer in use from reticle stage RS to reticle case RC held in reticle library 18. Reticle guiding device 21 is provided with a slider 22, carrier 23, loading arm 24, and unloading arm 25.

Slider 22 is provided so as to enable movement in the Y and Z directions inside reticle case RC stored in reticle library 18. Slider 22 extracts a reticle R housed parallel to the XY plane from reticle case RC, and returns reticle R to reticle case RC. Vacuum suction holes are provided in slider 22 for maintaining and releasing vacuum suction holding of reticle R by means of turning a vacuum pump, not shown in the figures, ON or OFF.

Carrier 23 is designed to enable movement in the X direction. Carrier 23 has a vacuum suction hole (not shown) on its bottom portion and performs vacuum suction holding and releasing of reticle R. Carrier 23 guides reticle R from the transfer position CAI with slider 22, to position CA2. A mechanism (not shown in the figures) is provided to carrier 23 for pre-aligning reticle R by holding it from two directions taking four sides as a standard.

Loading arm 24 and unloading arm 25 can move in the Y and Z directions. Further, loading arm 24 and unloading arm 25 are designed to move individually in the Y direction between position CA2 and reticle stage RS. Loading arm 24 and unloading arm 25 are designed to move in a unitary manner in the Z direction. As in the case of slider 22, a vacuum suction hole (not shown) is provided to loading arm 24 and unloading arm 25 for holding reticle R, with the vacuum suction holding and releasing of reticle R enabled by turning the vacuum ON or OFF.

The operation of an exposure device 7A (exposure devices 7B~7C being equivalent) having the structure described above will now be explained.

As shown in FIG. 2, a reticle case RC, in which the desired reticle from the reticle stocker (not shown) is housed, has been passed to AGV 3. Under the direction of a host computer, AGV 3 moves to and stops at a position in front of the front surface FA of exposure device 7A to which reticle case RC is to be transferred.

As shown in FIG. 1, a visible mark 14, including a mark 14A such as a round mark or circular mark as shown in FIG. 3 for example, is provided on opening/closing door 10 which is provided on front surface FA of exposure device 7A. AGV 3 detects the image of this visible mark 14 with an image detection device (not shown), and determines the transfer position for reticle case RC with guiding device 16, which is provided inside exposure device 7A, based on the position of this visible mark 14.

Based on the directives from the host computer, a computer for controlling exposure device 7A overall drives guiding device 16.

Namely, opening door 12 on the front surface FA of chamber 9 opens. Next, guiding arm 15 of guiding device 16, which is provided inside exposure device 7A, projects out from opening door 12 to the reticle case transfer position outside chamber 9.

AGV 3 communicates with the control computer for exposure device 7A by means of optical communications, for example. AGV 3 transfers reticle case RC, which has been guided from the reticle stocker, to guiding arm 15 of guiding device 16 while maintaining mutual timing.

Figure 5A:
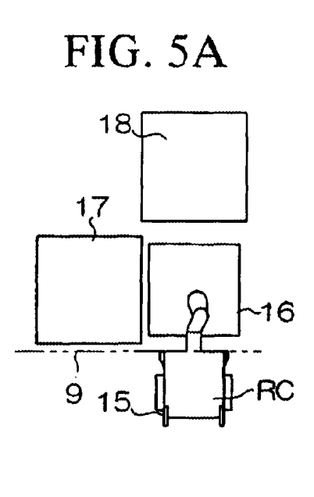
FIGS. 5A to 5H show a first embodiment of the present invention, and are planar views for explaining the reticle case guiding sequence in the guiding device disposed inside the exposure device.

FIGS. 5A to 5H are planar views for explaining the guiding sequence for reticle case RC of guiding device 16, which is disposed inside exposure device 7A. FIG. 5A shows the case in which reticle case RC has been transferred to guiding arm 15 of guiding device 16 from AGV, at the reticle case transfer position.

Figure 5B:
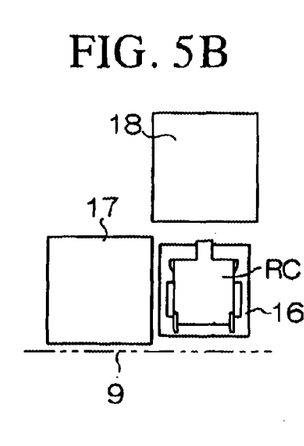
Figure 5C:
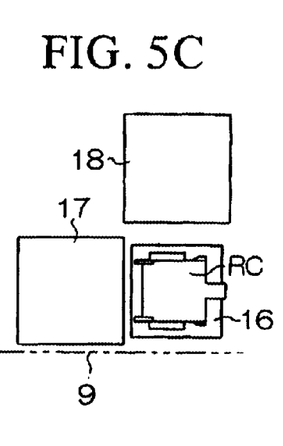

AGV 3 places reticle case RC on guiding arm 15 of guiding device 16, while at the same time the vacuum suction of guiding arm 15 is turned ON so that reticle case RC is held by vacuum suction. Next, as shown in FIG. 5B, guiding arm 15 pulls reticle case RC to the home position inside chamber 9. Then, as shown in FIG. 5C, guiding arm 15 is rotated 90° to direct reticle case RC in the direction of reticle case positioning device 17.

Figure 5D:
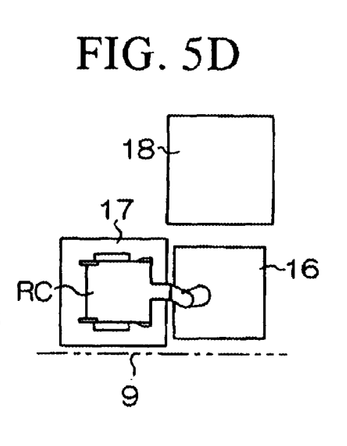

When transferring reticle case RC to reticle case positioning device 17, guiding arm 15 advances above reticle case positioning device 17 as shown in FIG. 5D. Then, reticle case transferring pins 50A, 50B, 50C rise to come in contact with the bottom surface of reticle case RC. The vacuum suction in guiding arm 15 is then turned OFF.

As a result, reticle case RC is transferred above reticle case transfer pins 50A, 50B, 50C. Guiding arm 15 then retreats below reticle case RC. Next, reticle case transfer pins 50A, 50B, 50C are lowered, and reticle case RC is loaded onto reticle case loading surface 17A.

Figure 6:
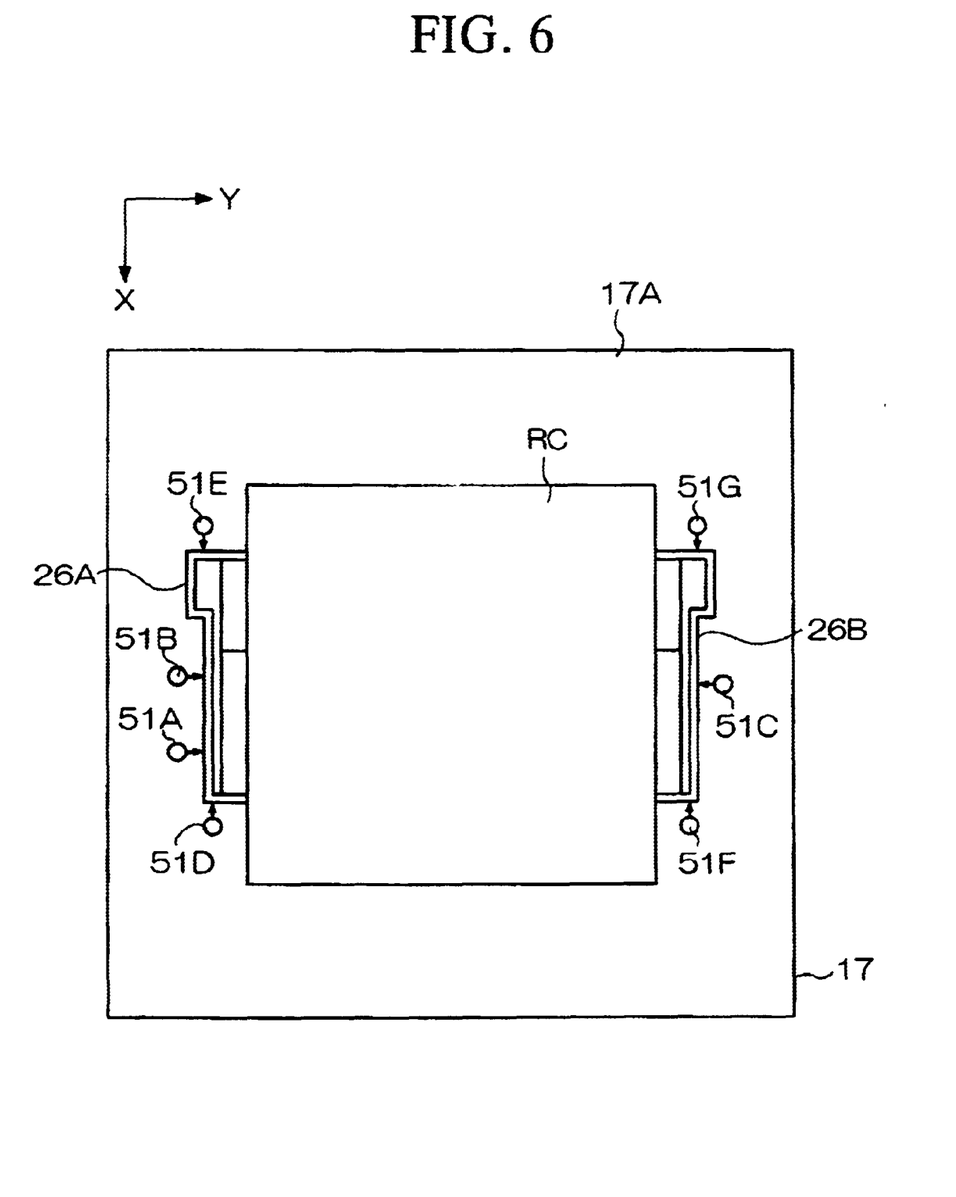
FIG. 6 is a planar view showing a reticle case that has been placed on to the reticle case loading surface of the reticle case positioning device that forms the present invention's exposure device.

FIG. 6 is a planar view showing reticle case RC which has been loaded onto reticle case loading surface 17A of reticle case positioning device 17. The positioning of reticle case RC by the computer of exposure device 7A will now be explained with reference to the figures.

The computer in exposure device 7A drives alignment pins 51A, 51B to a specific position in the Y direction, while at the same time driving alignment pin 51C to a specific position in the −Y direction, by means of a driving device inside reticle case positioning device 17. As a result of this movement, alignment pins 51A, 51B come into contact with guide 26A of reticle case RC, and are subjected to position control while being pushed in the −Y direction. Alignment pin 51C, which is on the opposite side, comes into contact with guide 26B, and is subjected to position control while being pushed in the −Y direction. As a result, the Y directional position and the rotational position in the θ direction of reticle case RC are controlled to a specific arrangement. Positioning of reticle case RC in the Y and θ directions is then carried.

Next, the computer in exposure device 7A drives alignment pins 51D to a specific position in the −X direction, while at the same time driving alignment pin 51E to a specific position in the +X direction. As a result of this driving, guide 26A defines the position in the X direction. At the same time, the computer drives alignment pin 51F to a specific position in the −X direction, and drives alignment pin 51G to a specific position in the +X direction. As a result, guide 26B defines the position in the X direction.

Reticle case RC moves in the X direction while being held by alignment pins 51A–51C, which carry out position control in the Yθ direction. Alignment pins 51A–51C come in contact with guides 26A, 26B of reticle case RC via rotating roller 52. Therefore, positioning of reticle case RC in the X direction is not hindered due to pressing of guides 26A, 26B by alignment pins 51A–51C. In this way, the positioning of reticle case RC is completed.

Once the positioning of reticle case RC by reticle case positioning device 17 is completed, the computer in exposure device 7A drives alignment pins 51A–51G so that they move away from the outer periphery of reticle case RC. Next, reticle case transferring pins 50A–50C rise, lifting up reticle case RC.

Figure 5E:
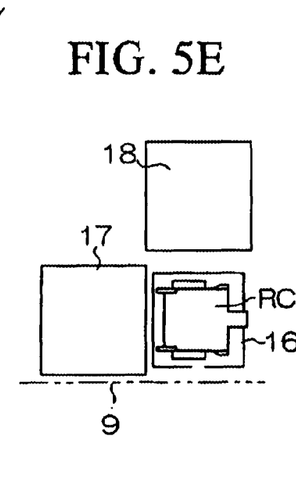

Next, guiding arm 15 of guiding device 16 moves below reticle case RC, and receives reticle case RC which is loaded on reticle case transferring pins 50A–50C. When guiding arm 15 receives reticle case RC, the vacuum suction is turned ON and reticle case RC is held in place. Guiding arm 15, which is holding reticle case RC once again, returns to the home position as shown in FIG. 5E.

Figure 5F:
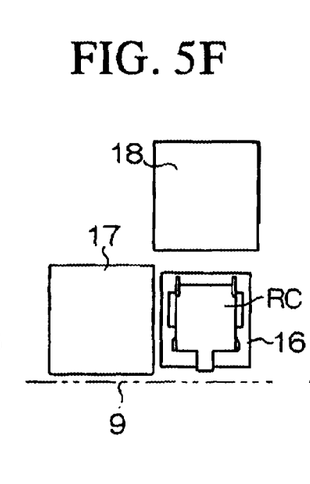
Figure 5G:
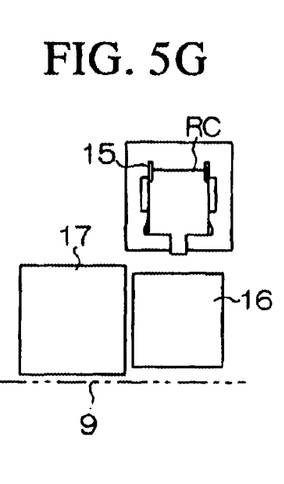

Once at the home position, guiding arm 15 rotates 90° as shown in FIG. 5F, to face in the direction of reticle library 18. Next, guiding arm 15, which is holding reticle case RC, determines a position at a specific height along the vertical axis (Z direction) not shown in the figures, and then advances into reticle library 18 at a specific position. The vacuum suction in guiding arm 15 is turned OFF. Guiding arm 15 retreats downward, and reticle case RC is automatically fixed in position by a reticle case automated fixing mechanism (not shown) that is housed in reticle library 18.

Figure 5H:
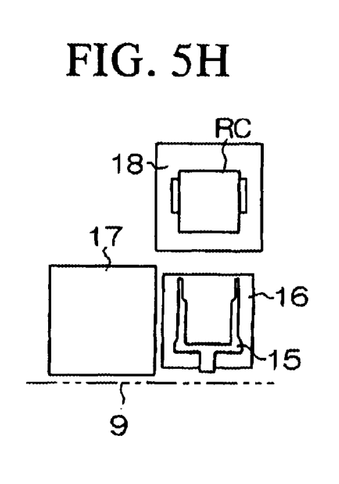

Guiding arm 15, which is now empty, again returns to the home position as shown in FIG. 5H, bringing the guiding sequence to an end. If guiding arm 15 rotates 180°, it returns to the state shown in FIG. 5B. In the case where a reticle which is not needed is removed from reticle library 18, the preceding sequence is carried out in reverse.

As shown in FIG. 1, slider 22 enters into reticle case RC and extracts a reticle R in reticle case RC, which is held inside reticle library 18. Slider 22 removes only this pre-designated reticle R, moving it in the −Y direction while holding it by vacuum suction means. While maintaining this arrangement, slider 22 moves to highest position along the Z direction, guiding reticle R to transfer position CA1 for transfer to carrier 23.

The transfer of reticle R is carried out at transfer position CA1, where slider 22 releases the suction hold on reticle R, and carrier 23 begins suction holding of reticle R via its vacuum suction holes. Carrier 23 guides reticle R from transfer position CA1 to position CA2 while suction holding reticle R. Reticle R undergoes pre-alignment at this point in time.

The transfer of reticle R to loading arm 24 is carried out at position CA2, where suction holding by carrier 23 is released and suction holding by loading arm 24 begins. Loading arm 24 moves reticle R in the Y direction while suction holding reticle R. Reticle R is then loaded onto reticle stage RS by releasing suction holding.

Reticle R held on top of reticle stage RS is illuminated with exposure light from the illuminating optical system in exposure system 20. As a result, the pattern image on reticle R is projected and transferred onto wafer W which is loaded on substrate stage ST via projection optical system PL.

When a reticle R that is not needed is extracted from reticle stage RS, unloading arm 25 suction holds reticle R which has been loaded on reticle stage RS, and moves to position CA2. The above-described sequence is then carried out in reverse, with reticle R stored in reticle library 18 via carrier 23 and slider 22.

AGV 3, which has transferred reticle case RC to guiding device 16 of exposure device 7A, moves to a position in front of side surface SC of exposure device 7C by running along running path 6A shown in FIG. 2. The transfer of reticle case RC is carried out here in the same manner as with exposure device 7A as described above. The guiding arm 15 of guiding device 16 which is disposed inside exposure device 7C projects outside chamber 9 through opening door 13 which meets running path 6A, and receives reticle case RC.

AGV 3 subsequently carries out the transfer of reticle case RC with guiding arm 15 of guiding device 16 which is projecting out from side surface SD of exposure device 7D and side surface SB of exposure device 7B by running along running path 6B and running path 6C sequentially.

When AGV 3 is traveling on a running path in this route, guiding arm 15 of guiding device 16 is projected out from the front surface FC of exposure device 7C, the front surface FD of exposure device 7D, and the side surface SB of exposure device 7B, enabling selection to carry out transfer of reticle case RC.

It is also possible to select a different route than that above.

Namely, by running in sequence on running paths 6D, 6C, and 6B, the guiding arm 15 of guiding device 16 is projected out from side surface SA of exposure device 7A, front surface FB or exposure device 7B, side surface SD of exposure device 7D and front surface FC of exposure device 7C, to enable optimal selection to carry out transfer of reticle case RC.

In the exposure device according to this embodiment of the present invention, opening doors 12,13 are provided on both the front surface FA and side surface SA, which is roughly perpendicular to front surface FA, of chamber 9. Guiding arm 15 of guiding device 16 projects to the outside from either of opening doors 12,13, to enable receipt of reticle case RC. Accordingly, it is possible to optimally select the position for receiving reticle case RC.

For this reason, the design of the layout when disposing exposure devices 7A~7D is not restricted by the position for receiving reticle case RC. Thus, the optimal disposition can be selected, and the installation space can be effectively utilized.

By disposing exposure devices 7A~7D so that both opening doors 12,13 of exposure devices 7A~7D meet one of running paths 6A~6D, the running path for AGV 3 for guiding reticle case RC can be optimally selected from a plurality of paths. Accordingly, the running path for AGV 3 when guiding reticle case RC can be selected for optimal efficiency.

Figure 7:
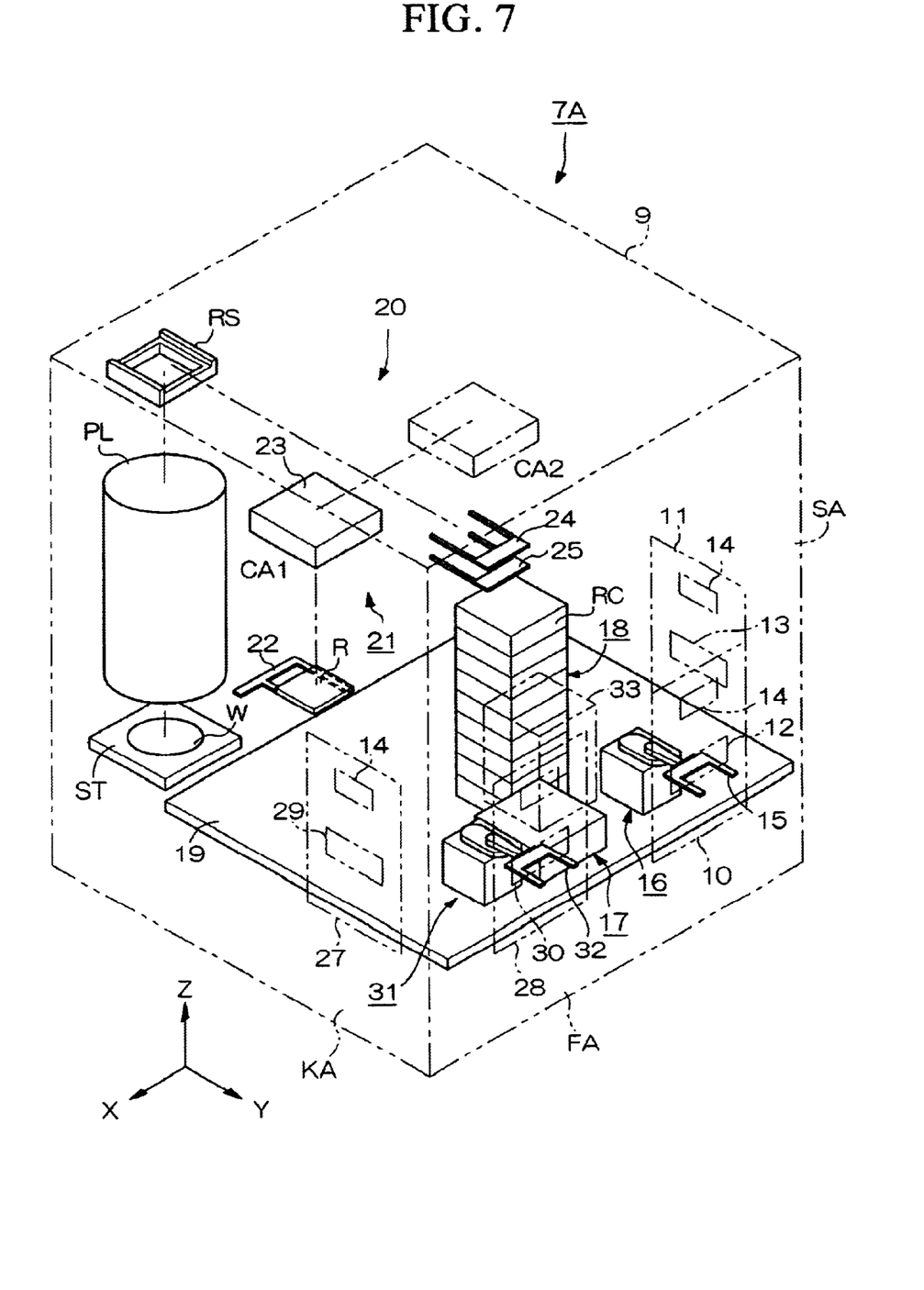
FIG. 7 shows a second embodiment of the present invention, and is a schematic structural view in which a plurality of guiding devices that can receive reticle cases by projecting out from a plurality of opening doors are disposed inside the chamber of an exposure device.
Figure 8:
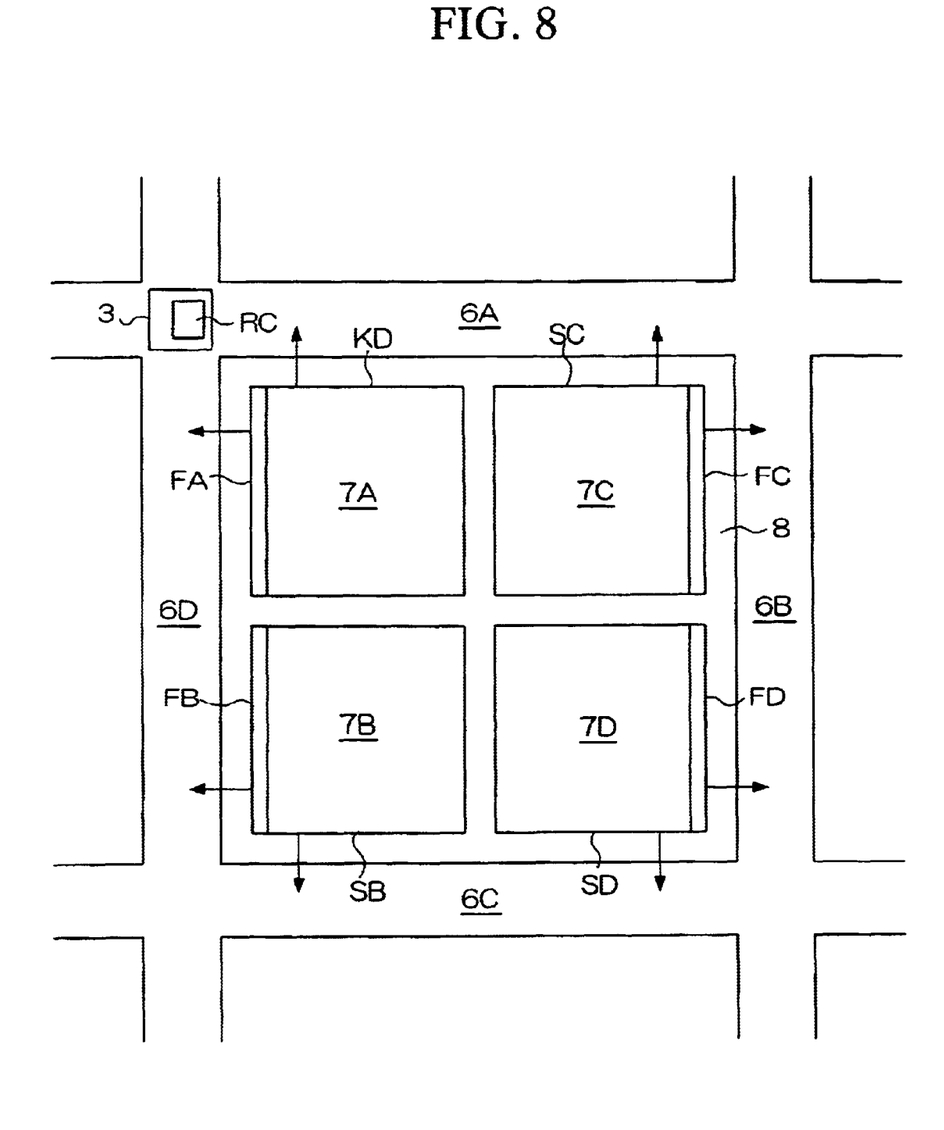
FIG. 8 shows a second embodiment of the present invention, and is a schematic structural view in which exposure devices are disposed so that a plurality of opening doors all meet running paths.

FIGS. 7 and 8 show a second embodiment of the exposure device according to this invention.

In these figures, structural elements that are the same as those of the first embodiment shown in FIGS. 1 through 6 have been assigned the same numeric symbol and an explanation thereof has been omitted. The second embodiment differs from the first embodiment with respect to the design of the chamber and the guiding device.

Namely, as shown in FIG. 7, opening/closing doors 10,28 that open and close via a hinge are provided at either edge of front surface FA. of chamber 9. Horizontally long opening door 12 and opening door (first receiving portion) 30 are provided at these opening/closing doors 10,28. In addition, respective visible marks 14,14 as shown in FIG. 3, are provided at opening/closing doors 10,28.

Opening/closing doors 11,27 that open and close via a hinge are provided at front surface FA and side surfaces SA and KA which are roughly perpendicular to front surface FA. Horizontally long opening door 13 and opening door (second receiving portion) 29 are provided at these opening/closing doors 11,27. In addition, respective visible marks 14,14, as shown in FIG. 3, are provided at opening/closing doors 11,27.

A guiding device 16 for receiving reticle R which was guided from the outside while housed in reticle case RC is provided on the inner side of opening/closing door 10,11. A guiding device 31 (substrate guiding device) for receiving s reticle R which was guided from the outside while housed in reticle case RC is provided at the inner side of opening/ closing door 27,28.

Guiding device 31 is disposed opposite guiding device 16 with reticle case positioning device 17 held therebetween. Guiding device 31 can receive reticle case RC by projecting guiding arm 32 from either of opening doors 29,30. Guiding arm 32 is designed to move in the vertical direction (Z direction). This guiding arm 32 can rotate in the XY plane, and is capable of telescopic motion with respect to its rotational axis. Guiding devices 16,31 are designed so that one or both of these can be freely selected and driven.

As shown in FIG. 8, the exposure devices 7A,7B, which are provided with a chamber 9 and guiding devices 16,31, respectively, are disposed at device installation 8 so that front surfaces FA, FB meet running path 6D. Similarly, exposure devices 7C,7D, which are provided with a chamber 9, and guiding devices 16,31, respectively, are disposed at device installation 8 so that front surfaces FC, FD meet running path 6B.

In addition to equivalent operations and effects as obtained in the preceding first embodiment, the exposure device according to this embodiment enables reticle case RC to be received from three directions in box-shaped chamber 9, by optimally selecting and separately using guiding devices 16,31. For this reason, there is an even greater degree of freedom when disposing exposure devices 7A~7D in device installation 8, enabling selection of an effective layout design.

In addition, respective front surfaces FA,FB of exposure devices 7A,7B meet the same running path 6D, while respective front surfaces FC,FD of exposure devices 7C,7D meet the same running path 6B. As a result, little movement is required when performing maintenance activities, for example, so that operations can be carried out efficiently.

Note that in the preceding embodiment, the present invention's substrate treating device employs a design in which the substrate treatment is an exposure treatment in which a pattern image on a reticle is projected and transferred on to a wafer. However, this invention is not limited thereto. For example, the present invention may also have a design which is applied to a coater for coating a photoresist to a wafer, or a developer for developing a wafer that was exposed in an exposure device. Further, although the present invention's substrate treating device employs a design in which the object being guided is a reticle, the present invention is not limited thereto. For example, the present invention's substrate treating device is also applicable to the case where the object being guided is a glass substrate used in a liquid crystal displays, or other substrates such as a mask or wafer.

In the preceding embodiment of the present invention's substrate treating device, when there are a plurality of reticle cases RC that have been guided by AGV 3 to be stored in reticle library 18 of exposure device 7A, the reticle cases RS received by guiding arm 15 are loaded and positioned on reticle case positioning device 17, and the action of storing the positioned reticle cases RC one at a time in a specific location in reticle library 18 is carried out repeatedly. In this case, a long period of time is required to move all the reticle cases RC from AGV 3 to reticle library 18 of exposure device 7A. Moreover, AGV 3 must remain stopped at the reticle transfer position of exposure device 7A during this time period. Conversely, even in the case where a plurality of reticle cases RC are removed from the reticle library 18 of one exposure device and transferred to AGV 3, considerable time is required to transfer all the reticle cases RC if the design employed is one in which the reticle cases RC removed from reticle library 18 are positioned one at a time on reticle case positioning device 17, and then the action of transferring a reticle case to AGV 3 is carried out repeatedly. As a result, AGV 3 is restricted during this time.

In order to eliminate this type of inconvenience, as shown in FIGS. 1 and 7, exposure device 7A as described above may be provided with a reticle case housing shelf 33 which can temporarily house a plurality of reticle cases RC near reticle case positioning device 17. In this case, when storing a plurality of reticle cases RC in reticle library 18 after receiving them from AGV 3, guiding arm 15 on the exposure device 7A side can sequentially house reticle cases RC transferred from AGV 3 in reticle housing shelf 33 without performing positioning. Once all of the reticle cases RC have been transferred, AGV 3 moves to the next operational position, and removes reticle cases RC that were temporarily housed in reticle case housing shelf 33 in order inside exposure device 7A. AGV 3 then guides the reticle cases RC onto reticle case positioning device 17, positions them, and houses them in a specific position in reticle library 18.

Conversely, when transferring a plurality of reticle cases RC to AGV 3 from reticle library 18 in exposure device 7A, guiding arm 15 extracts the designated reticle case RC from reticle library 18, loads it onto reticle case positioning device 17 and performs positioning. Then, the action of housing the reticle cases in reticle case housing shelf 33 is repeated until the extraction of all of the reticle cases RC is completed. By transferring reticle cases RC on which positioning has been completed in advance from reticle case housing shelf 33 to AGV 3 in sequence, it is possible to transfer a plurality of reticle cases RC from exposure device 7A to AGV 3 over a short period of time. By providing a reticle case housing shelf 33 that can temporarily store a plurality of reticle cases RC near reticle case positioning device 17 in this way, the time during which AGV 3 is restricted can be shortened, so that AGV 3 can be operated efficiently.

The preceding embodiment employed a type of AGV which runs on the floor of the clean room. However, the AGV used in this invention is not limited thereto. Namely, the AGV may be of the type that employs a motor or linear motor to transfer a reticle case guiding carrier along a track which has been installed above the reticle stocker and exposure device i.e., a design that employs so-called OHT (over head transportation) guiding. In this case, the opening door that is provided at the reticle stocker or exposure device for giving the reticle case and receiving the reticle case from the AGV may be provided in the upper surface of the reticle stocker or the exposure device.

Alternatively, a design may also be employed in which a track is provided at the floor surface where the reticle stocker and the exposure device are disposed, and the reticle case guiding carrier is sent along this track. In this case, the opening door for giving and receiving the reticle case may be provided in the lower surface of the reticle stocker and the exposure device. In addition, a design may also be employed in which AGV guiding and OHT guiding are combined, with AGV guiding used to guide the wafer and OHT guiding used to guide the reticle.

Regarding the exposure device, a step-and-repeat exposure device may be employed in which the pattern of reticle R is exposed while reticle R and wafer W are held still, and wafer W is then moved in sequential steps, or a scanning exposure device may be used in which the pattern of reticle R is exposed by synchronized moving of reticle R and wafer W. The type of exposure device is not limited to the exposure devices employed in semiconductor manufacturing. Rather, for example, liquid crystal exposure devices in which a liquid crystal display element pattern is exposed on a square glass plate, or exposure devices for manufacturing thin film magnetic heads, are also broadly applicable.

Regarding the light source for the illuminating optical system, not only KrF eximer lasers (248 nm), ArF eximer lasers (193 nm) and $F_2$ lasers (157 nm) may be used, but also charged particle beams such as X rays or electron beams can be used. For example, when employing an electron beam, thermoelectron radiating lanthanum hexaboride ($LaB_6$) or tantalum (Ta) can be used as the electron gun.

The magnification of the projection optical system PL may be a reducing system, equimultipling system, or an enlarging system. When an eximer laser is employed as the projection optical system PL, quartz or fluorite may be used as the transparent material. When using X-rays, a catadioptric system is used (with a reflecting type also employed for the reticle). In the case where an electron particle beam is employed, an electronic optical system consisting of an electronic lens and polarizing device can be employed as the optical system. The path taken by the electron beam is of course linear.

In addition, the present invention can also be employed in a proximity exposure device which does not employ a projection optical system and which exposes the pattern of a reticle R by closely adhering the reticle R and a wafer W together.

As explained above, the substrate treating device which is the first invention is provided with plurality of receiving portions where the substrate guiding device receives a substrate from the outside. As a result, in this substrate treating device, the position for receiving the substrate does not impose a restriction on the design of the layout for disposing the devices. Thus, the optimal disposition can be selected and the installation space can be effectively utilized. By disposing the substrate treating devices so that the receiving portion of each substrate treating device meets one of the running paths, it is possible to optimally select the running path for the AGV guiding the substrate from a plurality of running paths. Accordingly, since the running path for the AGV guiding the substrate can be selected for optimal efficiency, an improvement in production efficiency can be realized.

The substrate treating device according to the second invention is designed so that the first and second receiving portions from among a plurality of receiving portions are provided on different surfaces. As a result, in this substrate treating device, the substrate treating device can be disposed so that at least one of the different surfaces to which the first and second receiving portions are disposed meets a running path. Thus, in this substrate treating device, the position for receiving the substrate does not impose a restriction on the design of the layout for disposing the devices. Thus, the optimal disposition can be selected, and the installation space can be used effectively. Moreover, the running path for the AGV when guiding the substrate can be selected for optimal efficiency, so that an improvement in production efficiency can be realized.

The substrate treating device according to the third invention is designed so that the aforementioned different surfaces are roughly perpendicular to one another. Accordingly, in this substrate treating device, it is not absolutely essential that the devices all face the same direction. For example, the devices can be disposed back-to-back. As a result, in this substrate treating device, the position for receiving the substrate does not impose a restriction on the design of the layout for disposing the devices. Thus, the optimal disposition can be selected, and the installation space can be used effectively. Moreover, the running path for the AGV when guiding the substrate can be selected for optimal efficiency, so that an improvement in production efficiency can be realized.

The exposure device according to the fourth invention is designed to employ one of the substrate guiding device according to the first to third inventions for guiding a mask. Thus, in this exposure device, the position for receiving the mask does not impose a restriction on the design of the layout for disposing the devices. Thus, the optimal disposition can be selected, and the installation space can be used effectively. Moreover, by disposing the exposure devices so that the receiving portions for each of the exposure devices meet one of the running paths, the running path for the AGV when guiding the mask can be optimally selected from a plurality of running paths. Accordingly, the running path for the AGV guiding the mask can be selected for optimal efficiency, so that an improvement in production efficiency can be realized.

The exposure device according to the fifth invention is designed so that at least one of the plurality of receiving portions is present on the side surface of a box-shaped chamber that surrounds the exposure device. As a result, in this exposure device, the position for receiving the mask does not impose a restriction on the design of the layout for disposing the devices. Thus, the optimal disposition can be selected, and the installation space can be used effectively. Moreover, by disposing the exposure devices so that the receiving portion for each of the exposure devices meets one of the running paths, the running path for the AGV when guiding the mask can be optimally selected from a plurality of running paths. Accordingly, the running path for the AGV guiding the mask can be selected for optimal efficiency, so a that an improvement in production efficiency can be realized.

The substrate treating method according to the sixth invention has a step in which a substrate guiding device receives a substrate from the outside via at least one of a plurality of receiving portions. As a result, when executing this substrate treating method, the position for receiving the substrate does not impose a restriction on the design of the layout for disposing the devices. Thus, the optimal disposition can be selected, and the installation space can be used effectively. Moreover, by disposing the substrate treating devices so that the receiving portion for each of the substrate treating devices meets one of the running paths, the running path for the AGV when guiding the substrate can be optimally selected from a plurality of running paths. Accordingly, the running path for the AGV guiding the substrate can be selected for optimal efficiency, so. that an improvement in production efficiency can be realized.

The substrate treating method according to the seventh invention has a step in which the substrate is received via at least one of a first receiving portion and a second receiving portion that are provided on different surfaces. Accordingly, when executing this substrate treating method, the substrate treating device is disposed so that at least one of the different surfaces to which the first and second receiving portions are disposed meets a running path. As a result, when disposing the devices, there is no restriction imposed on the layout design by the position for receiving the substrate. Thus, the optimal disposition can be selected, and the installation space can be used effectively. Moreover, the running path for the AGV when guiding the substrate can be selected for optimal efficiency, so that an improvement in production efficiency can be realized.

The substrate treating method according to the eighth invention has a step in which the substrate is received via at least one of a first receiving portion and a second receiving portion that are provided on different surfaces that are roughly perpendicular to one another. Accordingly, when executing this substrate treating method, it is not absolutely essential that the devices all face the same direction. For example, the devices can be disposed back-to-back. As a result, when disposing the devices, there is no restriction imposed on the layout design by the position for receiving the substrate. Thus, the optimal disposition can be selected, and the installation space can be used effectively. Moreover, the running path for the AGV when guiding the substrate can be selected for optimal efficiency, so that an improvement in production efficiency can be realized.

The exposure method according to the ninth invention is designed to employ one of the substrate treating methods according to the first to third inventions for guiding a mask. Thus, in this exposure method, when disposing the devices, there is no restriction imposed on the layout design by the position for receiving the mask. Thus, the optimal disposition can be selected, and the installation space can be used effectively. Moreover, by disposing the exposure devices so that the receiving portions for each of the exposure devices meet one of the running paths, the running path for the AGV when guiding the mask can be optimally selected from a plurality of running paths. Accordingly, the running path for the AGV guiding the mask can be selected for optimal efficiency, so that an improvement in production efficiency can be realized.

The exposure device according to the tenth invention is designed so that at least one of the plurality of receiving portions is present on the side surface of a box-shaped chamber that surrounds the exposure device. Accordingly, in this exposure method, when disposing the devices, there is no restriction imposed on the layout design by the position for receiving the mask. Thus, the optimal disposition can be selected, and the installation space can be used effectively. Moreover, by disposing the exposure devices so that the receiving portions for each of the exposure devices meet one of the running paths, the running path for the AGV when guiding the mask can be optimally selected from a plurality of running paths. Accordingly, the running path for the AGV guiding the mask can be selected for optimal efficiency, so that an improvement in production efficiency can be realized.

What is claimed:

1. A scanning exposure device that exposes a pattern of a mask onto an object, comprising:

a mask guiding device that guides the mask received from outside the scanning exposure device; and a plurality of receiving portions including a first receiving portion provided at a first surface of the scanning exposure device, a second receiving portion provided at a second surface that is roughly perpendicular to the first surface of the scanning exposure device, and a visible mark provided at each of the plurality of receiving portions to visually confirm the each of the plurality of receiving portions.

2. The scanning exposure device according to claim 1, wherein a visible mark is provided at said receiving portions to visually confirm said receiving portions.

3. The scanning exposure device according to claim 1, wherein said mask received at said receiving portion is housed in a case.

4. An exposure method for exposing a pattern of a mask onto a photosensitive substrate using an exposure device having an exposure system, comprising:

guiding said mask or said substrate to at least one of a plurality of receiving portions provided at said exposure device by a first guiding device that can move around said exposure device to access each of the plurality of receiving portions, the plurality of receiving portions including a first receiving portion provided at a first surface of the exposure device and a second receiving portion provided at a second surface that is roughly perpendicular to the first surface of the exposure device; and guiding said mask or said substrate that was guided to said receiving portion into said exposure device by a second guiding device provided at said exposure device.

5. The exposure method according to claim 4, wherein said plurality of receiving portions are provided at a box-shaped chamber that encloses said exposure system.

6. The exposure method according to claim 5, wherein said first guiding device confirms said receiving portion based on a mark provided at said chamber.

7. The exposure method according to claim 5, wherein said plurality of receiving portions are provided respectively to surfaces of said chamber that are perpendicular to one another.

8. The exposure method according to claim 4, wherein a plurality of said exposure devices are provided, and said first guiding device guides either said mask or said substrate to said plurality of exposure devices.

9. The exposure method according to claim 8, wherein said plurality of receiving portions are provided in response to an installation arrangement of said plurality of exposure devices.

10. An exposure device that exposes a pattern of a mask onto a substrate, the exposure device comprising:

a plurality of receiving portions that receive said mask from outside the exposure device; and a mark that is provided at each of said plurality of receiving portions that enables detection from outside the exposure device.

11. The exposure device according to claim 10, wherein the exposure device is a scanning exposure device that exposes the substrate while the substrate is moving in a scanning direction.

12. The exposure device according to claim 10, further comprising an arm member that is capable of accessing all of the plurality of receiving portions.

13. A transferring method for transferring a mask to an exposure device by a guiding device that is capable of moving on a first running path and a second running path, said method comprising:

selecting said first running path or said second running path;

moving said guiding device to said exposure device by said selected running path; and transferring said mask to said exposure device, wherein said exposure device has a first mark corresponding to said first running path and a second mark corresponding to said second running path, and said guiding device transfers said mask to said exposure device by detecting either of said first mark or said second mark.

14. The transferring method according to claim 13, further comprising changing said selected running path.

15. The transferring method according to claim 13, wherein:

a plurality of said exposure devices are provided; and said guiding device transfers said mask to said plurality of exposure devices by running along said selected running path.

16. A transferring method according to claim 13, wherein the exposure device comprises a first exposure device and a second exposure device, a front surface of the first exposure device meeting the first running path and a front surface of the second exposure device meeting the second running path.

17. A device manufacturing method, comprising:

disposing a plurality of exposure devices, wherein said plurality of exposure devices can be accessed by a first running path and a second running path;

selecting one of said first running path and said second running path;

moving a guiding robot that guides an object via said selected running path; and transferring said object to one of said plurality of exposure devices, wherein each of said plurality of exposure devices has a first mark corresponding to said first running path and a second mark corresponding to said second running path, and said guiding robot transfers said object to said plurality of exposure devices by detecting one of either said first mark or said second mark.

18. The device manufacturing method according to claim 17, further comprising changing said selected running path.

19. The device manufacturing method according to claim 17, wherein said object is a mask on which a pattern is formed.

20. The device manufacturing method according to claim 17, wherein said plurality of exposure devices include a scanning exposure device that exposes said object while said object is being moved.

21. A device manufacturing method according to claim 17, wherein a front surface of a first exposure device of the plurality of exposure devices meets the first running path and a front surface of a second exposure device of the plurality of exposure devices meets the second running path.

22. A device manufacturing method according to claim 21, wherein at least one of the first exposure device and the second exposure device is a scanning exposure apparatus.

* * * * *